United States Patent
Yang et al.

(10) Patent No.: US 11,456,224 B2
(45) Date of Patent: Sep. 27, 2022

(54) SEMICONDUCTOR STRUCTURE WITH TEST STRUCTURE

(71) Applicant: NANYA TECHNOLOGY CORPORATION, New Taipei (TW)

(72) Inventors: Tsang-Po Yang, New Taipei (TW); Jui-Hsiu Jao, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 5 days.

(21) Appl. No.: 16/990,654

(22) Filed: Aug. 11, 2020

(65) Prior Publication Data

US 2022/0051955 A1 Feb. 17, 2022

(51) Int. Cl.
*H01L 21/66* (2006.01)
*H01L 27/108* (2006.01)

(52) U.S. Cl.
CPC .............. *H01L 22/34* (2013.01); *H01L 22/30* (2013.01); *H01L 22/32* (2013.01); *H01L 27/10805* (2013.01)

(58) Field of Classification Search
CPC ......... H01L 22/30; H01L 22/32; H01L 22/34; H01L 27/10805
USPC ......................................................... 257/48
See application file for complete search history.

(56) References Cited

U.S. PATENT DOCUMENTS

| | | | | |
|---|---|---|---|---|
| 8,704,226 B2 * | 4/2014 | Morimoto | ........ | H03K 19/00392 |
| | | | | 257/E21.526 |
| 11,133,272 B1 * | 9/2021 | Kolev | ................. | H01L 27/1203 |
| 2011/0193086 A1 * | 8/2011 | Lee | ....................... | H01L 27/108 |
| | | | | 257/E27.11 |
| 2019/0215472 A1 * | 7/2019 | Lee | ....................... | H01L 25/167 |
| 2021/0313281 A1 * | 10/2021 | Kaminaga | ......... | H01L 27/11556 |

FOREIGN PATENT DOCUMENTS

| | | | | | |
|---|---|---|---|---|---|
| DE | 102013202355 A1 | * | 8/2013 | ............... | G11C 5/06 |
| JP | 2012164704 A | * | 8/2012 | | |
| TW | I-393244 B1 | | 4/2013 | | |
| WO | WO-0137150 A1 | * | 5/2001 | ............. | G05B 15/02 |
| WO | WO-2014167867 A1 | * | 10/2014 | ............. | H01L 24/14 |

* cited by examiner

*Primary Examiner* — Matthew E Warren
(74) *Attorney, Agent, or Firm* — Muncy, Geissler, Olds & Lowe, P.C.

(57) ABSTRACT

The present disclosure provides a semiconductor structure having a test structure. The semiconductor structure includes a semiconductor substrate, a memory device and a test structure. The memory device is disposed on the semiconductor substrate, and includes a device area and an edge area. The edge area surrounds the device area. The test structure is disposed on the semiconductor substrate, and includes a dummy area, a test edge area and a plurality of unit cells. The test edge area surrounds the dummy area. The unit cells have a first group disposed in the dummy area and a second group disposed in the test edge area. The second group of unit cells includes the outermost unit cells of the plurality of unit cells. A shape surrounded by the edge area in a top view is different from a shape surrounded by the test edge area in the top view.

8 Claims, 8 Drawing Sheets

SEMICONDUCTOR STRUCTURE WITH TEST STRUCTURE

TECHNICAL FIELD

The present disclosure relates to a semiconductor structure, and more particularly, to a semiconductor structure having a test structure.

DISCUSSION OF THE BACKGROUND

In the process of producing memory devices, many steps are required to form the desired devices. In the process of forming a DRAM, for example, many steps are needed to form a capacitor and a transistor to build up a memory cell. To ensure the structures are correctly formed on the wafer by such steps, test structures are usually formed on the wafers.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor structure includes a semiconductor substrate, a memory device and a test structure. The memory device is disposed on the semiconductor substrate, and includes a device area and an edge area. The edge area surrounds the device area. The test structure is disposed on the semiconductor substrate, and includes a dummy area, a test edge area and a plurality of unit cells. The test edge area surrounds the dummy area. The plurality of unit cells include a first group disposed in the dummy area and a second group disposed in the test edge area. The second group of unit cells includes the outermost unit cells of the plurality of unit cells. A shape surrounded by the edge area in a top view is different from a shape surrounded by the test edge area in the top view.

In some embodiments, a side line of the test edge area in the top view is parallel to a side line of the edge area in the top view. A dimension of the side line of the test edge area is greater than a dimension of the side line of the edge area.

In some embodiments, the side line of the test edge area is comprised of a portion of the second group of unit cells.

In some embodiments, a side line of the test edge area in the top view is parallel to a side line of the edge area in the top view. A dimension of the side line of the test edge area is less than a dimension of the side line of the edge area.

In some embodiments, the side line of the test edge area is comprised of a portion of the second group of unit cells.

In some embodiments, a dimension of the test structure in a top view is different from a dimension of the memory device in the top view.

In some embodiments, the dimension of the memory device in the top view is greater than the dimension of the test structure in the top view.

In some embodiments, the dimension of the memory device in the top view is less than the dimension of the test structure in the top view.

Another aspect of the present disclosure provides a semiconductor structure including a semiconductor substrate, a memory device and a test structure. The memory device is disposed on the semiconductor substrate, and includes a device area and an edge area. The edge area surrounds the device area. The test structure is disposed on the semiconductor substrate, and includes a dummy area, a test edge area and a plurality of unit cells. The test edge area surrounds the dummy area. The plurality of unit cells are disposed in the test edge area, and the dummy area is free of the unit cells. A dimension of the test edge area in a top view is different from a dimension of the edge area in the top view.

In some embodiments, a side line of the test edge area in the top view is parallel to a side line of the edge area in the top view. A dimension of the side line of the test edge area is greater than a dimension of the side line of the edge area.

In some embodiments, the side line of the test edge area is comprised of a portion of the plurality of unit cells.

In some embodiments, a side line of the test edge area in a top view is parallel to a side line of the edge area in the top view. A dimension of the side line of the test edge area is less than a dimension of the side line of the edge area.

In some embodiments, the side line of the test edge area is comprised of a portion of the plurality of unit cells.

In some embodiments, a dimension of the edge area in a top view is greater than a dimension of the test edge area in the top view.

In some embodiments, the dimension of the edge area in the top view is less than the dimension of the test edge area in the top view.

Another aspect of the present disclosure provides a semiconductor structure including a semiconductor substrate, a memory device and a test structure. The memory device is disposed on the semiconductor substrate and comprises a plurality of first unit cells. The test structure is disposed on the semiconductor substrate and comprises a plurality of second unit cells. An arrangement of the first unit cells in a top view is different from an arrangement of the second unit cells in the top view.

In some embodiments, a side line of the arrangement of the first unit cells in the top view is parallel to a side line of the arrangement of the second unit cells in the top view. A dimension of the side line of the arrangement of the first unit cells is greater than a dimension of the side line of the arrangement of the second unit cells.

In some embodiments, a side line of the arrangement of the first unit cells in the top view is parallel to a side line of the arrangement of the second unit cells in the top view. The dimension of the side line of the arrangement of the first unit cells is less than the dimension of the side line of the arrangement of the second unit cells.

In some embodiments, the dimension of the arrangement of the first unit cells in the top view is greater than the dimension of the arrangement of the second unit cells in the top view.

In some embodiments, the dimension of the arrangement of the first unit cells in the top view is less than the dimension of the arrangement of the second unit cells in the top view.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

It should be understood that similar features in FIGS. 3 to 8 are identified by the same reference numerals for clarity and simplicity. Furthermore, similar elements in FIGS. 3 to 8 can include similar materials, and thus descriptions of such details are omitted in the interest of brevity.

Figure 1:
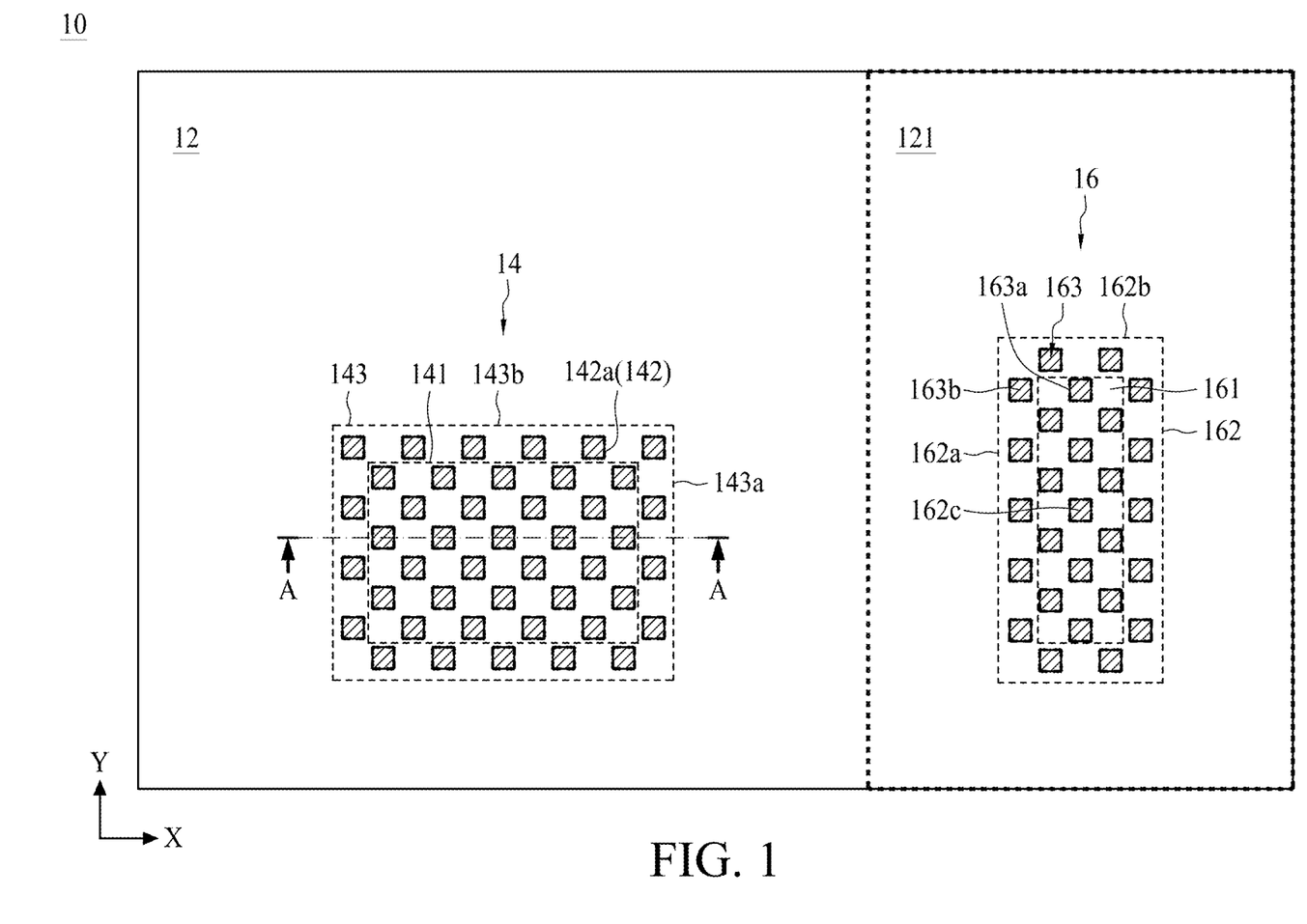
FIG. 1 is a top view of a semiconductor structure in accordance with some embodiments of the present disclosure.
Figure 2:
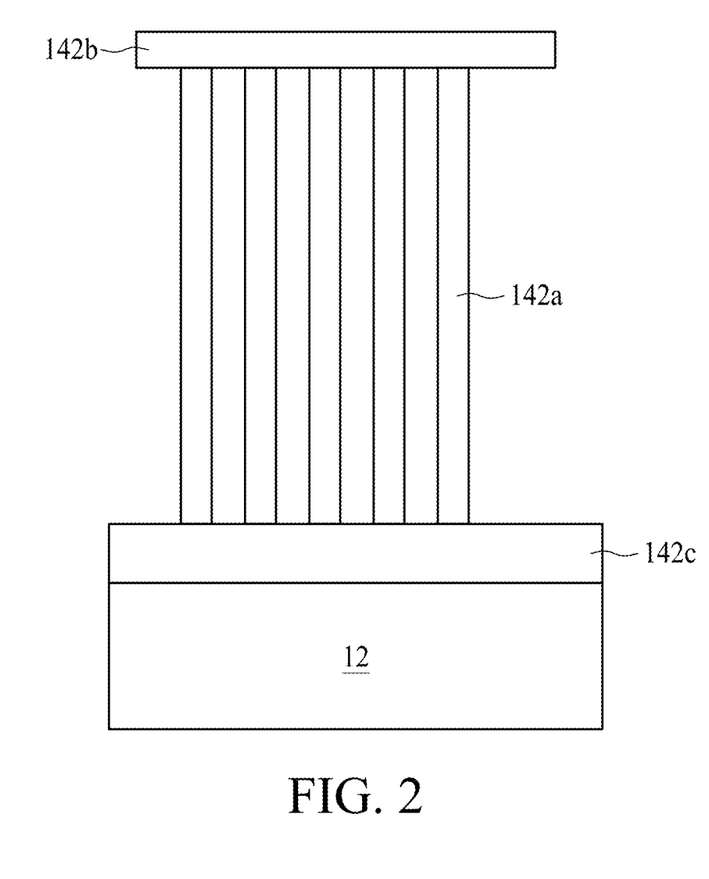
FIG. 2 is a cross-sectional view of the semiconductor structure along a line A-A in FIG. 1.

In accordance with some embodiments of the present disclosure, FIG. 1 is a top view of a semiconductor structure 10 and FIG. 2 is a cross-sectional view of the semiconductor structure 10 along a line A-A in FIG. 1. With reference to FIG. 1 and FIG. 2, in some embodiments, the semiconductor structure 10 includes a semiconductor substrate 12, a memory device 14 and a test structure 16.

In some embodiments, the semiconductor substrate 12 may be made of semiconductor materials, and the semiconductor substrate 12 may be, but is not limited to, bulk silicon, a semiconductor wafer, a silicon-on-insulator (SOI) substrate, or a silicon germanium substrate. Other semiconductor materials including group III, group IV, and group V elements may also be used.

In some embodiments, the memory device 14 is disposed on the semiconductor substrate 12. In some embodiments, the memory device 14 is a dynamic random-access memory (DRAM). The memory device 14 includes a plurality of unit cells 142. In some embodiments, each of the unit cells 142 includes a transistor and a capacitor 142a. The plurality of unit cells 142 are connected respectively with a bit lines and word lines. The transistors, the hit lines and the word lines are not shown in the figures for clarity. In some embodiments, the capacitors 142a are disposed between two metal layers 142b and 142c (as shown in FIG. 2).

In some embodiments, the unit cells 142 are disposed in an array arrangement. The gap between any two of the unit cells 142 may be the same. The size of the gap is not limited. The memory device 14 may include a device area 141 and an edge area 143. The edge area 143 surrounds the device area 141. The device area 141 and the edge area 143 are defined by the function of the unit cells 142. In other words, the unit cells 142 in the device area 141 function as memory cells of the memory device 14, and the unit cells 142 in the edge area 143 function as dummy cells of the memory device 14. In some embodiments, the edge area 143 includes the outermost unit cells 142 of the memory device 14.

The test structure 16 is disposed on the semiconductor substrate 12. In some embodiments, the test structure 16 is disposed in a scribe line area 121 of the semiconductor substrate 12. The test structure 16 includes a dummy area 161, a test edge area 162 and a plurality of unit cells 163. The test edge area 162 surrounds the dummy area 161. In some embodiments, each of the unit cells 163 includes a transistor and a capacitor 162c. The transistors are not shown in the figures for clarity. In some embodiments, the unit cells 163 in the dummy area 161 are disposed in an array arrangement. In some embodiments, the arrangement of the unit cells 142 of the memory device 14 in a top view is different from the arrangement of the unit cells 163 in a top view.

In some embodiments, the unit cells 163 have a first group 163a and a second group 163b. The first group 163a of the unit cells 163 is disposed in the dummy area 161. The second group 163b of the unit cells 163 is disposed in the test edge area 162. The first group 163a and the second group 163b may have the same structure or different structures. The first group 163a of the unit cells 163 in the dummy area

161 may be used for simulating the unit cells 142 in the device area 141 of the memory device 14. The second group 163b of the unit cells 163 may be used for simulating the unit cells 142 in the edge area 143 of the memory device 14. In some embodiments, the unit cells 163 in the second group 163b include the outermost unit cells 163 of the test structure 16.

In some embodiments, a shape surrounded by the edge area 143 in a top view is different from a shape surrounded by the test edge area 162 in the top view. The shape surrounded by the edge area 143 in the top view is the same as the shape of the device area 141 in the top view. The shape surrounded by the test edge area 162 in the top view is the same as the shape of the dummy area 161 in the top view. In some embodiments, the shape surrounded by the edge area 143 or the shape of the device area 141 in the top view is the shape collectively formed by the unit cells 142. In some embodiments, the shape surrounded by the test edge area 162 or the shape of the dummy area 161 in the top view is the shape collectively formed by the unit cells 163. In some embodiments, a dimension of the test structure 16 in the top view is different from a dimension of the memory device 14 in the top view. In some embodiments, the dimension of the memory device 14 in the top view is greater than the dimension of the test structure 16 in the top view. It should be noted that the dimension of the memory device 14 or the test structure 16 is the dimension occupied by the memory device 14 or the test structure 16.

In some embodiments, the shape surrounded by the edge area 143 may be square, rectangle or another suitable shape. The shape surrounded by the test edge area 162 may be square, rectangle or another suitable shape. The shapes surrounded by the edge area 143 and the test edge area 162 are different rectangles as an example, but are not intended to be limiting to the present inventive concept.

The side lines 162a and 162b of the test edge area 162 are respectively parallel to the side lines 143a and 143b of the edge area 143. The side lines 143a, 143b of the edge area 143 are comprised of a portion of the unit cells 142. The side lines 162a, 162b of the test edge area 162 are comprised of a portion of the second group 163a of the unit cells 163. In some embodiments, a dimension of the side line 162a (extending in a Y direction) of the test edge area 162 is greater than a dimension of the side line 143a (extending in the Y direction) of the edge area 143. In some embodiments, a dimension of the side line 162b (extending in an X direction) of the test edge area 162 is less than a dimension of the side line 143b (extending in the X direction) of the edge area 143. In other words, the length of the side line 162a is greater than the length of the side line 143a, and the length of the side line 162b is less than the length of the side line 143b.

Generally, the capacitors 142a in the edge area 143 may not be capable of functioning as the capacitors 142a in the device area 141. In other words, the capacitors 142a in the edge area 143 of the memory device 14 are non-functional and are used as dummy capacitors. In some embodiments of the present disclosure, the test structure 16 may be used for testing the capability of the capacitors 142a in the edge area 143 of the memory device 14.

In summary, the test edge area 162 of the test structure 16 may be designed as a testing sample of the edge area 143 of the memory device 14. For example, dimensions of the side lines 162a, 162b of the test edge area 162 may be greater than or less than dimensions of the side lines 143a, 143b of the edge area 143. When the dimensions of the side lines 162a of the test edge area 162 are greater than the dimensions of the side lines 143a of the edge area 143, the test results (for example, the quality of the capacitors 162c) of the test edge area 162 may be better than or worse than the test results of the edge area 143 of the memory device 14. As a result, the structure of the edge area 143 of the memory device 14 may be redesigned based on the test edge area 162. The same result may also be obtained when the dimensions of the side lines 162b of the test edge area 162 are greater than the dimensions of the side lines 143b of the edge area 143.

Further, based on the test results of the test edge area 162, the capacitors 142a in the edge area 143 of the memory device 14 may be redesigned for other purposes (for example, for use as decoupling capacitors). In other words, when the capability of the capacitors 162c in the test edge area 162 is greater than a predetermined parameter, the capacitors 142a in the edge area 143 of the memory device 14 may have the capability for different functions.

Figure 3:
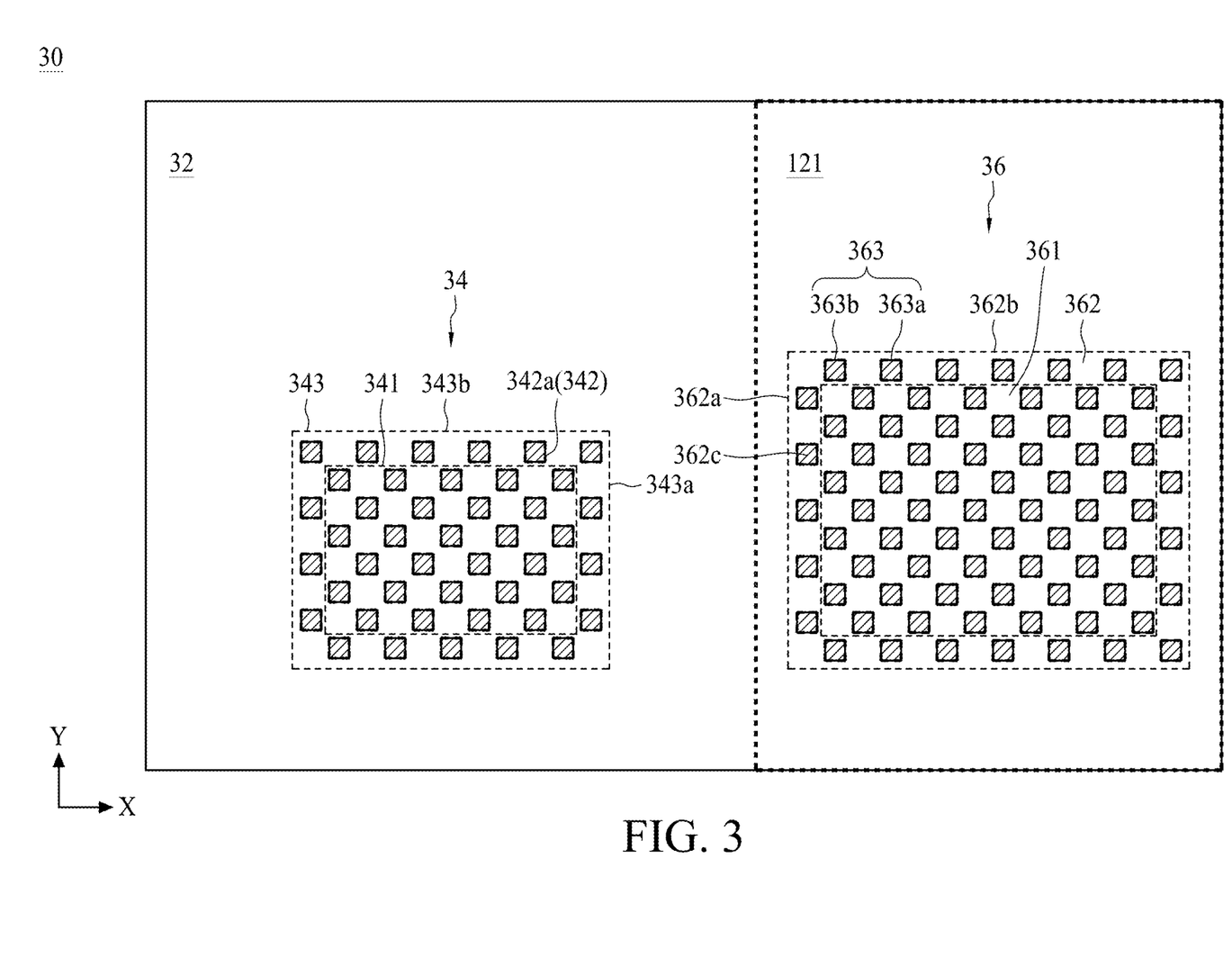
FIG. 3 is a top view of a semiconductor structure in accordance with some embodiments of the present disclosure.

In accordance with some embodiments of the present disclosure, FIG. 3 is a top view of a semiconductor structure 30. With reference to FIG. 3, in some embodiments, the semiconductor structure 30 includes a semiconductor substrate 32, a memory device 34 and a test structure 36. In some embodiments, the memory device 34 includes a plurality of unit cells 342. Each of the unit cells 342 includes a transistor and a capacitor 342a. In some embodiments, the memory device 34 may include a device area 341 and an edge area 343. The memory device 34 is similar to the memory device 14 in FIG. 1 and FIG. 2, and repeated details thereof are omitted for brevity.

The test structure 36 includes a dummy area 361, a test edge area 362 and a plurality of unit cells 363. In some embodiments, the unit cells 363 include a first group 363a and a second group 363b. The difference between the test structure 36 and the test structure 16 in FIG. 1 is that dimensions of both of the side lines 362a and 362b of the test edge area 362 are greater than dimensions of both of the side lines 343a and 343b of the edge area 343. In other words, the lengths of both of the side lines 362a and 362b are greater than the lengths of both of the side lines 343a and 343b. In some embodiments, the dimensions of the test structure 36 in a top view are greater than the dimensions of the memory device 14 in a top view.

In short, the dimensions of the side lines 362a, 362b of the test edge area 362 are both greater than the dimensions of the side lines 343a, 343b of the edge area 343. The test results (for example, the quality of the capacitors 362c) of the test edge area 362 may be better than or worse than the test results of the edge area 343 of the memory device 34. For example, the capacitors 362c of the side lines 362a (extending in the Y direction) may have different test results compared to the capacitors 362c of the side lines 362b (extending in the X direction). As a result, the structure of the edge area 343 of the memory device 34 may be redesigned based on the test edge area 362. Further, based on the test results of the test edge area 362, the capacitors 342a in the edge area 343 of the memory device 34 may be redesigned for other purposes (for example, for use as decoupling capacitors). In other words, when the capability of the capacitors 362c in the test edge area 362 is greater than a predetermined parameter, the capacitors 342a in the edge area 343 of the memory device 34 may have the capability for different functions.

Figure 4:
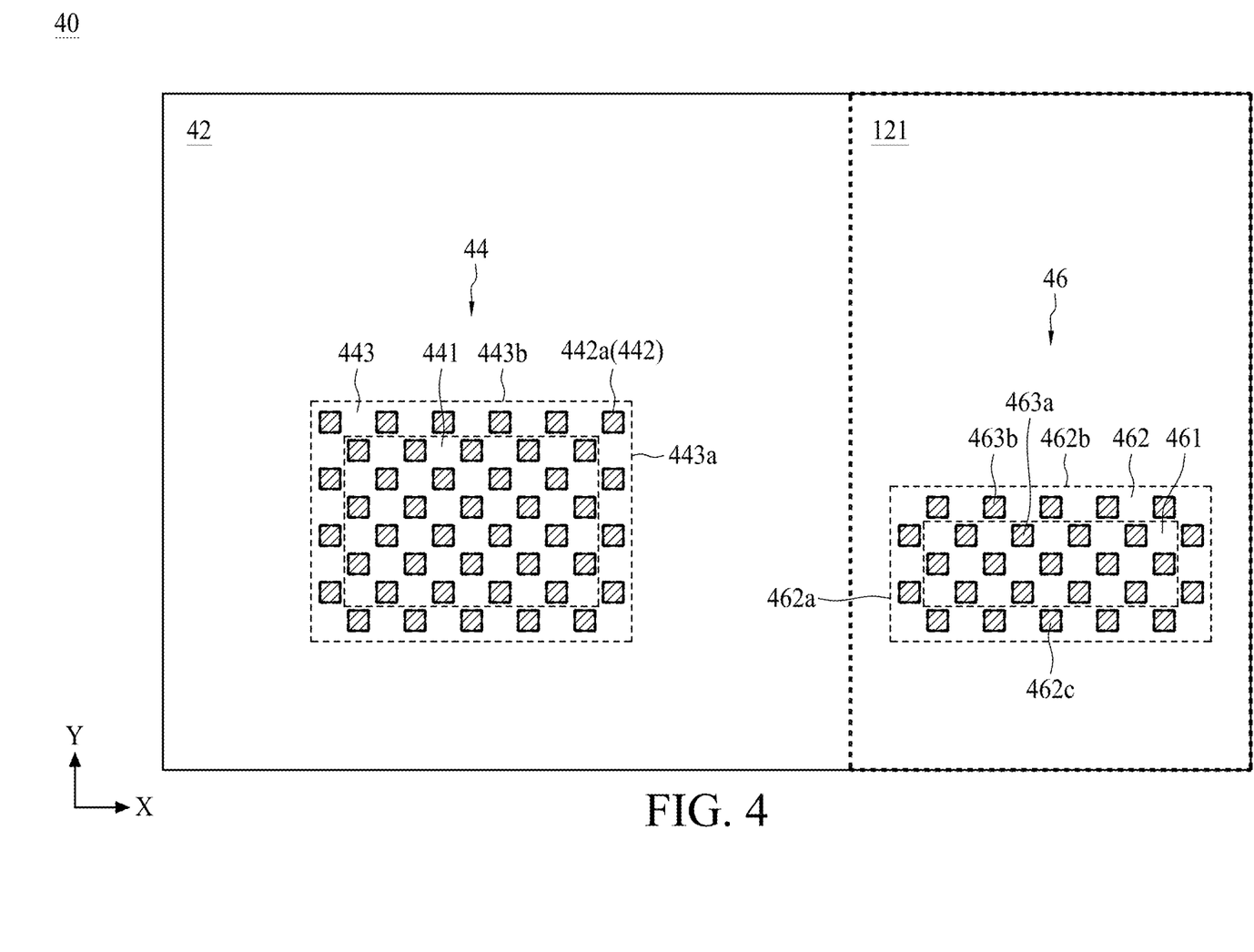
FIG. 4 is a top view of a semiconductor structure in accordance with some embodiments of the present disclosure.

In accordance with some embodiments of the present disclosure, FIG. 4 is a top view of a semiconductor structure 40. With reference to FIG. 4, in some embodiments, the semiconductor structure 40 includes a semiconductor substrate 42, a memory device 44 and a test structure 46. In some embodiments, the memory device 44 includes a plurality of unit cells 442. Each of the unit cells 442 includes a transistor and a capacitor 442a. In some embodiments, the memory device 44 may include a device area 441 and an edge area 443. The memory device 44 is similar to the memory device 14 in FIG. 1 and FIG. 2, and repeated details thereof are omitted for brevity.

The test structure 46 includes a dummy area 461, a test edge area 462 and a plurality of unit cells 463. In some embodiments, the unit cells 463 have a first group 463a and a second group 463b. The difference between the test structure 46 and the test structure 16 in FIG. 1 is that a dimension of the side line 462a (extending in the Y direction) of the test edge area 462 is less than a dimension of the side line 443a (extending in the Y direction) of the edge area 443, and a dimension of the side line 462b (extending in the X direction) of the test edge area 462 is greater than a dimension of the side line 443b of the edge area 443 (extending in the X direction). In other words, the length of the side line 462a is less than the length of the side line 443a and the length of the side line 462b is less than the length of the side line 443b.

In short, the length of the side line 462a (extending in the Y direction) of the test edge area 462 is less than the length of the side line 443a (extending in the Y direction) of the edge area 443, and the length of the side line 462b (extending in the X direction) of the test edge area 462 is greater than the length of the side line 443b of the edge area 443 (extending in the X direction). The test results (for example, the quality of the capacitors 462c) of the test edge area 462 may be better than or worse than the test results of the edge area 443 of the memory device 44. For example, the capacitors 462c of the side lines 462a (extending in the Y direction) may have different test results compared to the capacitors 462c of the side lines 462b (extending in the X direction). As a result, the structure of the edge area 443 of the memory device 44 may be redesigned based on the test edge area 462. Further, based on the test results of the test edge area 462, the capacitors 442a of the edge area 443 of the memory device 44 may be redesigned for other purposes (for example, for use as decoupling capacitors). In other words, when the capability of the capacitors 462c in the test edge area 462 is greater than a predetermined parameter, the capacitors 442a in the edge area 443 of the memory device 44 may have the capability for different functions.

Figure 5:
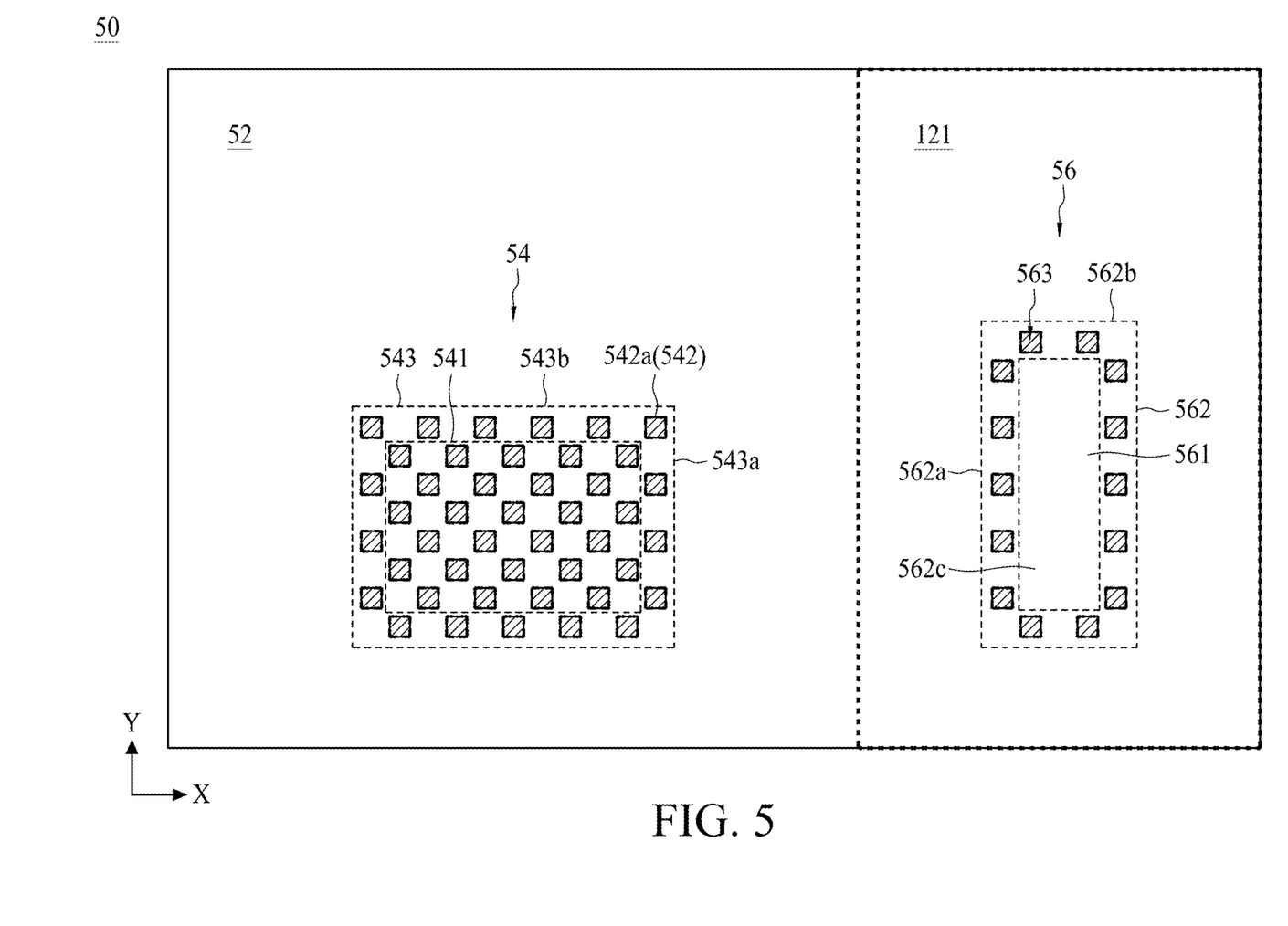
FIG. 5 is a top view of a semiconductor structure in accordance with some embodiments of the present disclosure.

In accordance with some embodiments of the present disclosure, FIG. 5 is a top view of a semiconductor structure 50. With reference to FIG. 5, in some embodiments, the semiconductor structure 50 includes a semiconductor substrate 52, a memory device 54 and a test structure 56. In some embodiments, the memory device 54 includes a plurality of unit cells 542. Each of the unit cells 542 includes a transistor and a capacitor 542a. In some embodiments, the memory device 54 may include a device area 541 and an edge area 543. The memory device 54 is similar to the memory device 14 in FIG. 1 and FIG. 2, and repeated details thereof are omitted for brevity.

The test structure 56 includes a dummy area 561, a test edge area 562 and a plurality of unit cells 563. The difference between the test structure 56 and the test structure 16 in FIG. 1 is that the plurality of unit cells 563 are disposed in the test edge area 562 and the dummy area 561 is free of the unit cells 563. In other words, the unit cells 563 are not disposed in the dummy area 561. In some embodiments, a dimension of the side line 562a (extending in the Y direction) of the test edge area 562 is greater than a dimension of the side line 543a (extending in the Y direction) of the edge area 543, and a dimension of the side line 562b (extending in the X direction) of the test edge area 562 is less than a dimension of the side line 543b of the edge area 543 (extending in the X direction). In other words, the length of the side line 562a is greater than the length of the side line 543a and the length of the side line 562b is less than the length of the side line 543b.

In short, the length of the side line 562a (extending in the Y direction) of the test edge area 562 is greater than the length of the side line 543a (extending in the Y direction) of the edge area 543, and the length of the side line 562b (extending in the X direction) of the test edge area 562 is less than the length of the side line 543b of the edge area 543 (extending in the X direction). The test results (for example, the quality of the capacitors 562c) of the test edge area 562 may be better than or worse than the test results of the edge area 543 of the memory device 54. For example, the capacitors 562c of the side lines 562a (extending in the Y direction) may have different test results compared to the capacitors 562c of the side lines 562b (extending in the X direction). As a result, the structure of the edge area 543 of the memory device 54 may be redesigned based on the test edge area 562. Further, based on the test results of the test edge area 562, the capacitors 542a of the edge area 543 of the memory device 54 may be redesigned for other purposes (for example, for use as decoupling capacitors). In other words, when the capability of the capacitors 562c in the test edge area 562 is greater than a predetermined parameter, the capacitors 542a of the edge area 543 of the memory device 54 may have the capability for different functions.

Moreover, the dummy area 561 can be free of the unit cells 563 and the test results of the test edge area 562 may not be influenced by the structure of the dummy area 561.

Figure 6:
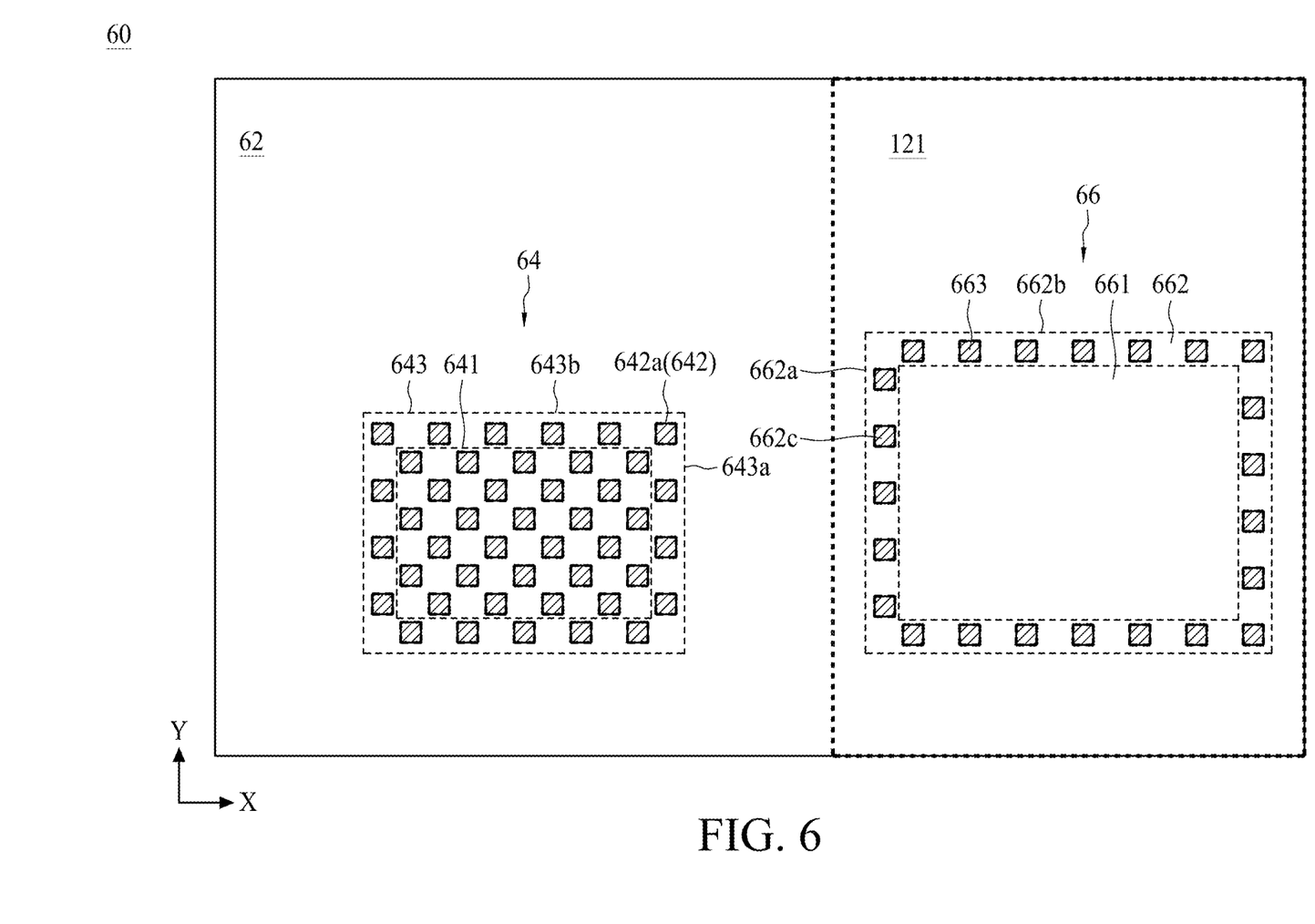
FIG. 6 is a top view of a semiconductor structure in accordance with some embodiments of the present disclosure.

In accordance with some embodiments of the present disclosure, FIG. 6 is a top view of a semiconductor structure 60. With reference to FIG. 6, in some embodiments, the semiconductor structure 60 includes a semiconductor substrate 62, a memory device 64 and a test structure 66. In some embodiments, the memory device 64 includes a plurality of unit cells 642. Each of the unit cells 642 includes a transistor and a capacitor 642a. In some embodiments, the memory device 64 may include a device area 641 and an edge area 643. The memory device 64 is similar to the memory device 14 in FIG. 1 and FIG. 2, and repeated details thereof are omitted for brevity.

The test structure 66 includes a dummy area 661, a test edge area 662 and a plurality of unit cells 663. The difference between the test structure 66 and the test structure 56 in FIG. 5 is that dimensions of both the side line 662a (extending in the Y direction) and the side line 662b (extending in the X direction) of the test edge area 662 are greater than dimensions of both the side line 643a (extending in the Y direction) and the side line 643b (extending in the X direction) of the edge area 643. In other words, the lengths of both of the side lines 662a and 662b are greater than the lengths of both of the side lines 643a and 643b.

In short, the lengths of both the side line 662a (extending in the Y direction) and the side line 662b (extending in the X direction) of the test edge area 662 are greater than the lengths of both the side line 643a (extending in the Y direction) and the side line 643b (extending in the X direction) of the test edge area 662. The test results (for example, the quality of the capacitors 662c) of the test edge area 662 may be better than or worse than the test results of the edge area 643 of the memory device 64. For example, the capacitors 662c of the side lines 662a (extending in the Y direction) may have different test results compared to the capacitors 662c of the side lines 662b (extending in the X direction). As a result, the structure of the edge area 643 of the memory device 64 may be redesigned based on the test edge area 662. Further, based on the test results of the test edge area 662, the capacitors 642a of the edge area 643 of the memory device 64 may be redesigned for other purposes (for example, for use as decoupling capacitors). In other words, when the capability of the capacitors 662c in the test edge area 662 is greater than a predetermined parameter, the capacitors 642a of the edge area 643 of the memory device 64 may have the capability for different functions.

Moreover, the dummy area 661 can be free of the unit cells 663 and the test results of the test edge area 662 may not be influenced by the structure of the dummy area 661.

Figure 7:
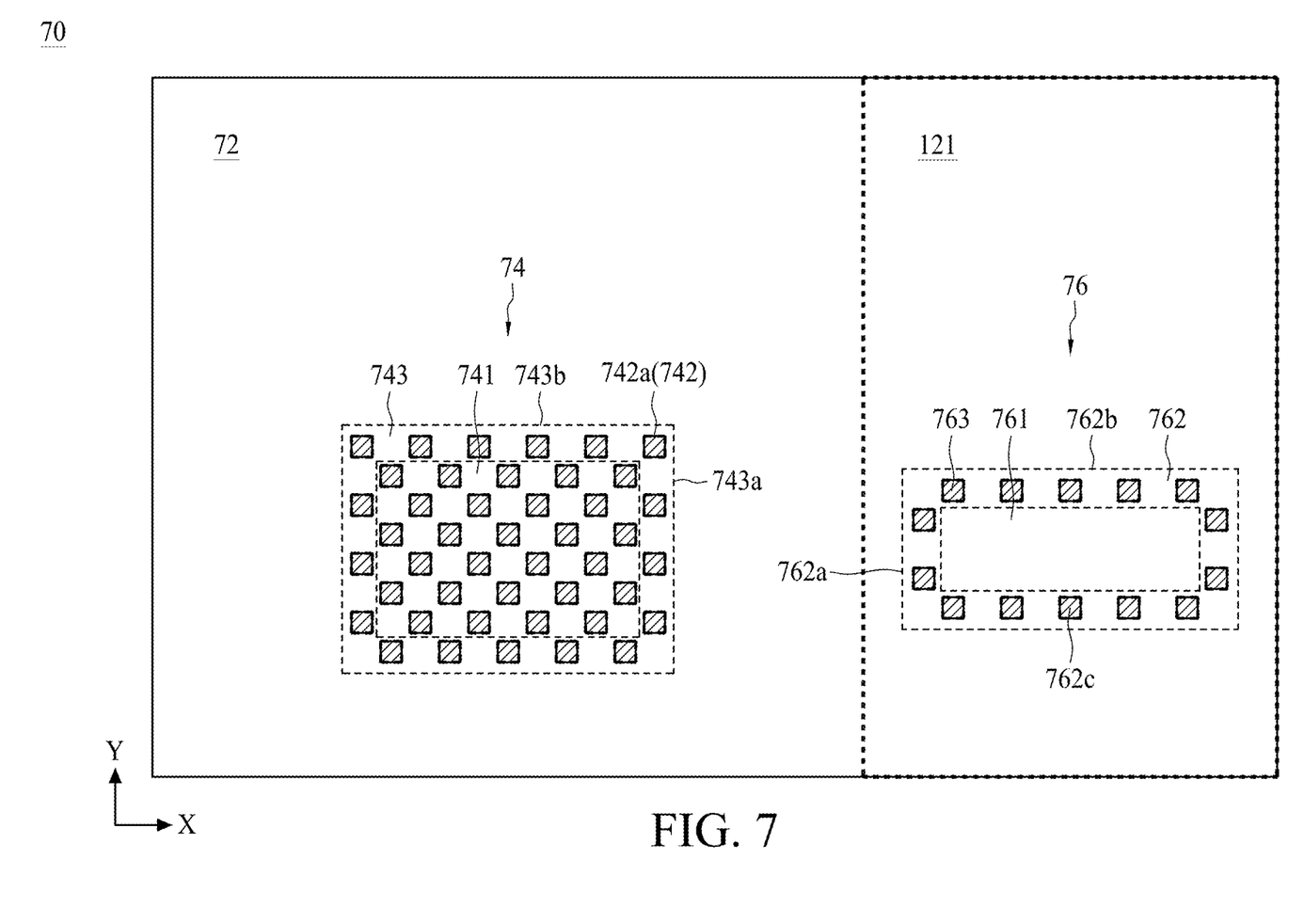
FIG. 7 is a top view of a semiconductor structure in accordance with some embodiments of the present disclosure.

In accordance with some embodiments of the present disclosure, FIG. 7 is a top view of a semiconductor structure 70. With reference to FIG. 7, in some embodiments, the semiconductor structure 70 includes a semiconductor substrate 72, a memory device 74 and a test structure 76. In some embodiments, the memory device 74 includes a plurality of unit cells 742. Each of the unit cells 742 includes a transistor and a capacitor 742a. In some embodiments, the memory device 74 may include a device area 741 and an edge area 743. The memory device 74 is similar to the memory device 14 in FIG. 1 and FIG. 2, and repeated details thereof are omitted for brevity.

The test structure 76 includes a dummy area 761, a test edge area 762 and a plurality of unit cells 763. The difference between the test structure 76 and the test structure 56 in FIG. 5 is that a dimension of the side line 762a (extending in the Y direction) of the test edge area 762 is less than a dimension of the side line 743a (extending in the Y direction) of the edge area 743, and a dimension of the side line 762b (extending in the X direction) of the test edge area 762 is greater than a dimension of the side line 743b of the edge area 743 (extending in the X direction). In other words, the length of the side line 762a is less than the length of the side line 743a, and the length of the side line 762b is greater than the length of the side line 743b.

In short, the length of the side line 762a (extending in the Y direction) of the test edge area 762 is less than the length of the side line 743a (extending in the Y direction) of the edge area 743, and the length of the side line 762b (extending in the X direction) of the test edge area 762 is greater than the length of the side line 743b of the edge area 743 (extending in the X direction). The test results (for example, the quality of the capacitors 762c) of the test edge area 762 may be better than or worse than the test results of the edge area 743 of the memory device 74. For example, the capacitors 762c of the side lines 762a (extending in the Y direction) may have different test results compared to the capacitors 762c of the side lines 762b (extending in the X direction). As a result, the structure of the edge area 743 of the memory device 74 may be redesigned based on the test edge area 762. Further, based on the test results of the test edge area 762, the capacitors 742a of the edge area 743 of the memory device 74 may be redesigned for other purposes (for example, for use as decoupling capacitors). In other words, when the capability of the capacitors 762c in the test edge area 762 is greater than a predetermined parameter, the capacitors 742a of the edge area 743 of the memory device 74 may have the capability for different functions.

Moreover, the dummy area 761 can be free of the unit cells 763 and the test results of the test edge area 762 may not be influenced by the structure of the dummy area 761.

Figure 8:
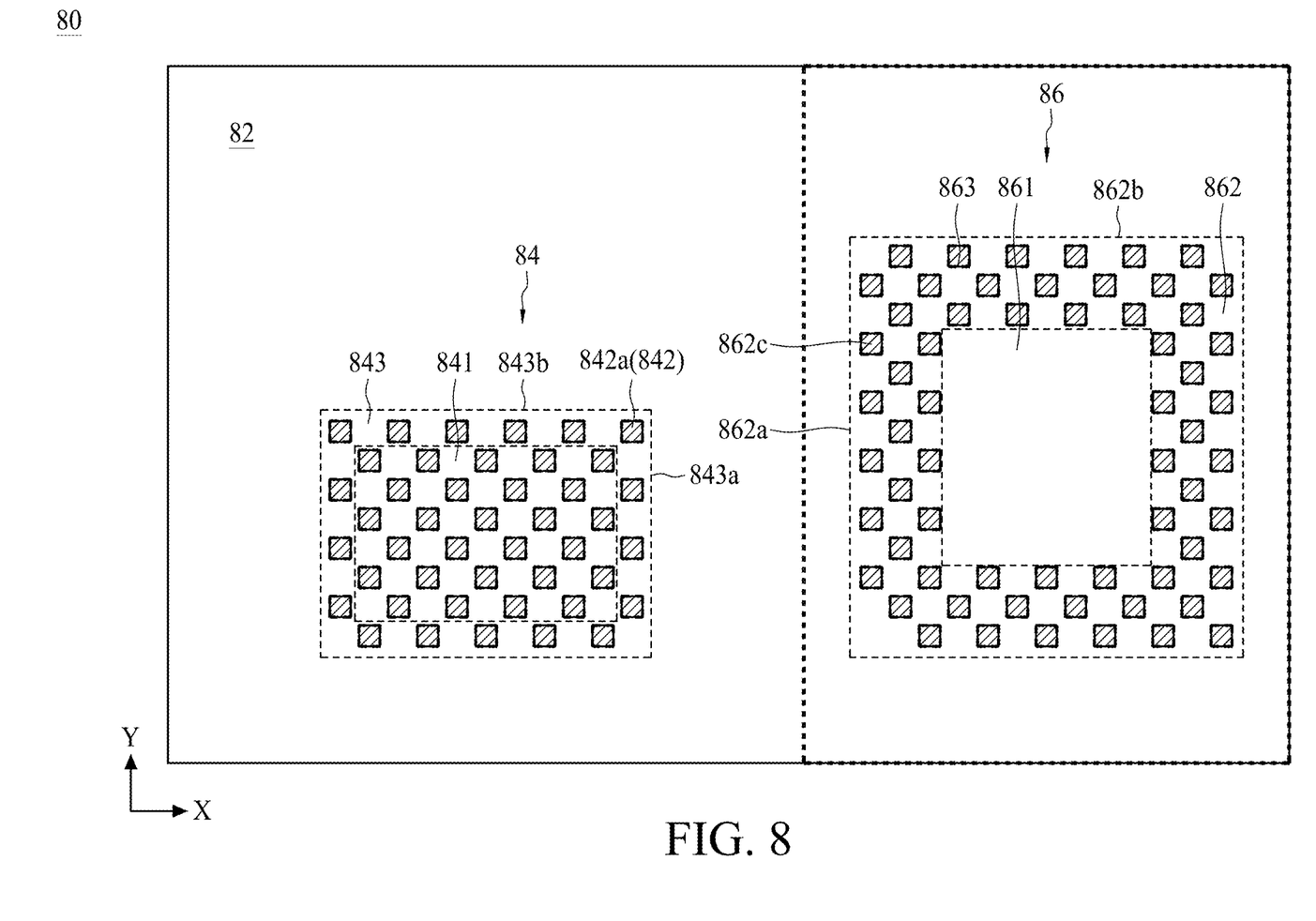
FIG. 8 is a top view of a semiconductor structure in accordance with some embodiments of the present disclosure.

In accordance with some embodiments of the present disclosure, FIG. 8 is a top view of a semiconductor structure 80. With reference to FIG. 8, in some embodiments, the semiconductor structure 80 includes a semiconductor substrate 82, a memory device 84 and a test structure 86. In some embodiments, the memory device 84 includes a plurality of unit cells 842. Each of the unit cells 842 includes a transistor and a capacitor 842a. In some embodiments, the memory device 84 may include a device area 841 and an edge area 843. The memory device 84 is similar to the memory device 14 in FIG. 1 and FIG. 2, and repeated details thereof are omitted for brevity.

The test structure 86 includes a dummy area 861, a test edge area 862 and a plurality of unit cells 863. The difference between the test structure 86 and the test structure 56 in FIG. 5 is that dimensions of both the side line 862a (extending in the Y direction) and the side line 862b (extending in the X direction) of the test edge area 862 are greater than dimensions of both the side line 843a (extending in the Y direction) and the side line 843b (extending in the X direction) of the edge area 843. In other words, the lengths of both of the side lines 862a and 862b are greater than the lengths of both of the side lines 843a and 843b. Further, the unit cells 863 of the test structure 86 are disposed in an array arrangement.

In short, the test results (for example, the quality of the capacitors 862c) of the test edge area 862 may be better than or worse than the test results of the edge area 843 of the memory device 84. For example, the capacitors 862c of the side lines 862a (extending in the Y direction) may have different test results compared to the capacitors 862c of the side lines 862b (extending in the X direction). As a result, the structure of the edge area 843 of the memory device 84 may be redesigned based on the test edge area 862. Further, based on the test results of the test edge area 862, the capacitors 842a of the edge area 843 of the memory device 84 may be redesigned for other purposes (for example, for use as decoupling capacitors). In other words, when the capability of the capacitors 862c of the test edge area 862 is greater than a predetermined parameter, the capacitors 842a of the edge area 843 of the memory device 84 may have the capability for different functions.

Moreover, the dummy area 861 can be free of the unit cells 863 and the test results of the test edge area 862 may not be influenced by the structure of the dummy area 861. Further, with the unit cells 863 of the test structure 86 being disposed in an array arrangement, the factor of a distance of the unit cells 863 from the dummy area 861 may also be considered.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A semiconductor structure, comprising:
   a semiconductor substrate;
   a memory device, disposed on the semiconductor substrate and comprising:
     a device area; and
     an edge area adjacent to the device area; and
   a test structure, disposed on the semiconductor substrate and comprising:
     a dummy area;
     a test edge area, adjacent to the dummy area; and
     a plurality of unit cells, having a first group disposed in the dummy area and a second group disposed in the test edge area;
   wherein the second group of unit cells comprises the outermost unit cells of the plurality of unit cells,
   a shape surrounded by the edge area in a top view is different from a shape surrounded by the test edge area in the top view.

2. The semiconductor structure of claim 1, wherein a side line of the test edge area in the top view is parallel to a side line of the edge area in the top view; and
   a dimension of the side line of the test edge area is greater than a dimension of the side line of the edge area.

3. The semiconductor structure of claim 2, wherein the side line of the test edge area is comprised of a portion of the second group of unit cells.

4. The semiconductor structure of claim 1, wherein a side line of the test edge area in the top view is parallel to a side line of the edge area in the top view; and
   a dimension of the side line of the test edge area is less than a dimension of the side line of the edge area.

5. The semiconductor structure of claim 4, wherein the side line of the test edge area is comprised of a portion of the second group of unit cells.

6. The semiconductor structure of claim 1, wherein a dimension of the test structure in the top view is different from a dimension of the memory device in the top view.

7. The semiconductor structure of claim 6, wherein the dimension of the memory device in the top view is greater than the dimension of the test structure in the top view.

8. The semiconductor structure of claim 6, wherein the dimension of the memory device in the top view is less than the dimension of the test structure in the top view.

* * * * *